(12) United States Patent
Foong et al.

(10) Patent No.: US 9,658,253 B2
(45) Date of Patent: May 23, 2017

(54) CONTACT ASSEMBLY IN A TESTING APPARATUS FOR INTEGRATED CIRCUITS

(71) Applicant: JF MICROTECHNOLOGY SDN. BHD., Petaling Jaya, Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 54 days.

(21) Appl. No.: 14/971,604

(22) Filed: Dec. 16, 2015

(65) Prior Publication Data

US 2016/0178692 A1    Jun. 23, 2016

(30) Foreign Application Priority Data

Dec. 17, 2014    (MY) .......................... PI 2014003476

(51) Int. Cl.
*G01R 31/00* (2006.01)
*G01R 3/00* (2006.01)
*G01R 1/073* (2006.01)

(52) U.S. Cl.
CPC ............ *G01R 3/00* (2013.01); *G01R 1/07307* (2013.01); *G01R 1/07371* (2013.01)

(58) Field of Classification Search
CPC ............ G01R 1/07307; G01R 1/07342; G01R 1/0466; G01R 1/07314; G01R 31/2879; G01R 31/2886; G01R 31/2889; G01R 31/2896; G01R 1/0408; G01R 1/0483; G01R 1/06722; G01R 31/2648; G01R 31/2891

See application file for complete search history.

(56) References Cited

U.S. PATENT DOCUMENTS

| | | | | | |
|---|---|---|---|---|---|
| 5,012,924 | A | * | 5/1991 | Murphy | H05K 13/021 206/719 |
| 2010/0207654 | A1 | * | 8/2010 | Hsu | G01R 1/06716 324/756.03 |

* cited by examiner

*Primary Examiner* — Tung X Nguyen
(74) *Attorney, Agent, or Firm* — Maschoff Brennan

(57) ABSTRACT

An electrical contact assembly for use in an integrated circuit testing apparatus having a plurality of electrical contact pins and electrical insulators that are each fashioned with through-openings that match a cross-section of a rigid shaft so that the rigid shaft can be threaded through the contact pins and insulators. This ensures that the position of each contact pin is substantially aligned in a single datum with other contact pins following the datum of the rigid shaft. The electrical insulators are placed between each contact pin to prevent electrical connection between contact pins. Further, four rigid shafts assembled in this manner may be interlocked with each other to form a rectangular assembly, which can be inserted into an appropriate housing of the testing apparatus.

11 Claims, 8 Drawing Sheets

CONTACT ASSEMBLY IN A TESTING APPARATUS FOR INTEGRATED CIRCUITS

FIELD OF INVENTION

The present invention relates generally to electrical contacts, and more specifically to an electrical contact assembly in an integrated circuit testing apparatus.

BACKGROUND OF INVENTION

In certain branches of integrated circuit (IC) device testing, besides the usual requirements of speed and reliability, the power and temperature handling capacity of the testing apparatus is of key importance. Ease of maintenance and replacement of contact pins are also important factors, as these keep productivity levels up.

Testing at these higher power levels result in higher temperatures within the testing apparatus. High temperatures can cause expansion of only certain parts of the apparatus, due to different materials being used in different parts of the design, and this can then lead to stack-up issues such as poor co-planarity, loss/reduction of contact due to offset of contact pins, and uneven contact pins, among others.

Cantilever contact pins are known for its ability to test devices at higher current and power levels. Although solutions utilizing cantilever pins exist for high current/power IC device testing, the designs of the contact pin assembly make the testing apparatus prone to the above faults and disadvantages.

What is needed in the art is an IC device testing apparatus which is able to withstand the temperatures associated with high current/power testing, without losing too much of its alignment and tolerance. What is also needed in the art is an IC device testing apparatus which allows easy replacement of faulty contact pins.

SUMMARY OF INVENTION

The present invention seeks to overcome the aforementioned disadvantages by providing an electrical contact assembly for use in an integrated circuit testing apparatus having a plurality of electrical contact pins and electrical insulators that are each fashioned with through-openings that match a cross-section of a rigid shaft so that the rigid shaft can be threaded through the contact pins and insulators. This ensures that the position of each contact pin is substantially aligned in a single datum with other contact pins following the datum of the rigid shaft. The electrical insulators are placed between each contact pin to prevent electrical connection between contact pins. Further, four rigid shafts assembled in this manner may be interlocked with each other to form a rectangular assembly, which can be inserted into an appropriate housing of the testing apparatus.

The electrical contact assembly of the present invention may be used particularly in an integrated circuit (IC) device test in which high testing current and power is required.

This invention thus relates to an electrical contact assembly for use in an integrated circuit testing apparatus, comprising: a substantially rigid shaft having a cross-section of a particular shape and size, and constructed of an electrically insulating material; a plurality of contact pins, each contact pin having a through-opening substantially matching to the particular shape and size of the cross-section of said rigid shaft, such that the rigid shaft may slide through the through-opening of the contact pin and thus secure the contact pin from substantial rotation about a longitudinal axis of the rigid shaft; and at least one electrical insulator, each electrical insulator having a through-opening substantially matching to the particular shape and size of the cross-section of the rigid shaft, such that the rigid shaft may slide through the through-opening of the electrical insulator and thus secure the electrical insulator from substantial rotation about a longitudinal axis of the rigid shaft, and each electrical insulator placed between any two contact pins, such that there is no electrical connection between the two contact pins.

Each contact pin and electrical insulator includes a sheet-like base portion, on which base portion the through-opening is formed.

The contact pins used in the present invention may be of any known type, with the main distinction of having a through-opening that matches the cross-section of the rigid shaft. However, in a preferred embodiment, the contact pin is a cantilever type, and includes an upper, cantilever arm extending from a first side of the base portion, a first contact portion connected to an end of said cantilever arm, which first contact portion is adapted, during testing, to connect electrically with a suitable contact on an integrated circuit device. The contact pin further includes a lower, stationary arm extending from a second side of the base portion, and a second contact portion connected to an end of the stationary arm, the second contact portion adapted, during operation, to connect electrically with a suitable contact on a testing apparatus. The stationary arm is substantially stationary during testing. However, when the rectangular assembly is inserted into the testing apparatus housing, the stationary arm is slightly flexed from its initial state, so that there is some tension on the testing apparatus contact, ensuring a good electrical contact during testing of an IC device.

The length of the cantilever arm and the stationary arm is variable, and depends on the position of the contact pad of the IC device being tested. In some uses, contact pins that have shorter arms may be used in the same instance with contact pins that have longer arms.

As mentioned, the through-opening of each contact pin and electrical insulator must match the cross-section of the rigid shaft, so that the rigid shaft can be threaded through those through-openings. The goal is to prevent or reduce as much as possible movement of the contact pins, in relation to each other and to the rigid shaft, during testing. In a preferred embodiment, the through-openings of the contact pins and electrical insulators, as is the cross-section of the rigid shaft, has a rectangular shape. However, it can be imagined that many other shapes of through-openings may work just as well.

Another aspect of this invention is the interlocking, end to end, of four rigid shafts, in a perpendicular fashion to each other, so as to form a square or rectangular assembly, whereby the rigid shafts form the outline of the square. This allows rows of contact pins to be arranged in a typical square or rectangular design seen in an IC device testing apparatus.

In a preferred embodiment, this interlocking is achieved by each rigid shaft having a notch at a first end, this notch adapted to receive a second end of an adjoining rigid shaft. In this way, two rigid shafts can be interlocked, in a perpendicular fashion. Four rigid shafts may then be interlocked in this manner, and arranged to form a square or rectangular assembly, with the first end of each rigid shaft interlocked with the second end of the rigid shaft next to it.

Thus, the present invention provides for a much more precise alignment of contact pins, even so in the high temperatures during testing. This invention prescribes an assembly design that arrests the rotational motion of the contact pins in relation to the axis of the rigid shaft, which translates to more predictable and reliable alignment of the contact pins in relation to each other and to the contact pads of IC devices.

Another advantage of the present invention is that it does not require the rectangular assembly of the four rigid shafts to engage with the housing walls of the testing apparatus, so that movement or positional changes of the testing apparatus will have a much lesser effect on the position of the contact pins.

The present invention also relates to a feature that allows easier assembly of the above-mentioned rectangular assemblies into a housing of the testing apparatus. This is done by having a dowel pin through-hole at one end of each rigid shaft. As the rectangular assemblies are lowered into the housing cavity of a testing apparatus, each through-hole is aligned with a dowel pin located on the housing, so that accurate assembly is assured. Further, the placement of the through-holes on each batch of rigid shafts can be changed for quick and easy customization of contact pin configurations.

Yet another advantage of the present invention is thus the ease of changing faulty pins that is inherent in the assembly design. Any faulty contact pin is easily replaced by simply removing the rectangular assembly from the apparatus housing, separating the rigid shaft that holds the faulty pin, and replacing the faulty pin. Once the pin is replaced, the rigid shafts are again joined with each other to form the rectangular assembly, and then lowered into the apparatus housing. The precision of each contact pin is maintained due to the design of this assembly.

The present invention further relates to a method of assembling the above electrical contact assembly. This method comprises the steps of:
a) sliding a rigid shaft through a matching through-opening of a contact pin, until the contact pin reaches an intermediate point along the rigid shaft;
b) sliding the rigid shaft through a matching through-opening of an electrical insulator, until the electrical insulator rests next to the contact pin along the rigid shaft;
c) sliding the rigid shaft through a matching through-opening of a second contact pin, until the second contact pin rests next to the electrical insulator along the rigid shaft, and the electrical insulator is sandwiched between the first and second contact pins;
d) repeating steps b) and c) until the desired number of contact pins has been arranged along the rigid shaft, according to the contact pad arrangement of the device being tested;
e) joining a first end of the rigid shaft to a second end of a second rigid shaft such that both rigid shafts are interlocked, in a perpendicular fashion;
f) joining a third and fourth rigid shaft as in e), such that the four rigid shafts form a rectangular assembly;
g) fitting said rectangular assembly into a testing apparatus housing.

Other objects and advantages will be more fully apparent from the following disclosure and appended claims.

DETAILED DESCRIPTION OF INVENTION

It should be noted that the following detailed description is directed to an electrical contact assembly of an integrated circuit (IC) testing apparatus, and is not limited to any particular size or configuration but in fact a multitude of sizes and configurations within the general scope of the following description.

LIST OF NUMBERED ELEMENTS IN FIGURES

Rigid shaft (10)
Rigid shaft sub-assembly (100)
First end of rigid shaft (102)
Second end of rigid shaft (104)
Notch (106)
Dowel pin through-hole (108)
Contact pin (20)
Contact pin base portion (202)
First side of base portion (2021)
Second side of base portion (2022)
Cantilever arm (204)
Cantilever arm end (2042)
First contact portion (205)
Stationary arm (206)
Stationary arm end (2062)
Second contact portion (207)
Through-opening of contact pin (208)
Electrical insulator (30)
Electrical insulator base portion (302)
Through-opening of electrical insulator (308)
Rectangular assembly (50)
Test apparatus housing (60)
Dowel pins (62)
Top cover (64)

FIGS. 1 through 6 show, in various views, the complete assembly, or parts of, a rigid shaft sub-assembly (100) of the present invention.

Figure 2:
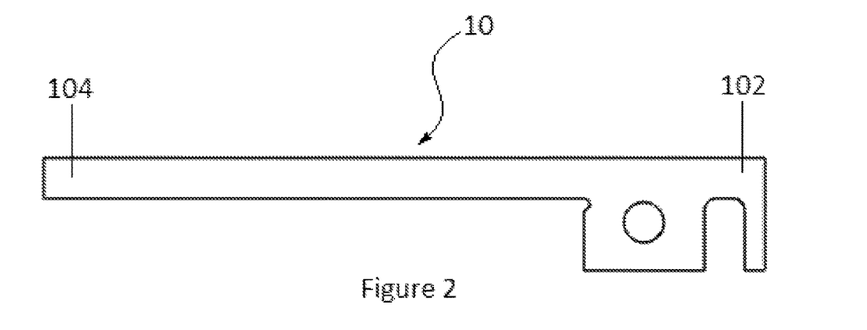
FIG. 2 shows a top view of a rigid shaft in an embodiment of the present invention.

Referring to FIG. 2, there is shown a rigid member (10) having a first end (102) and a second end (104).

Figure 3:
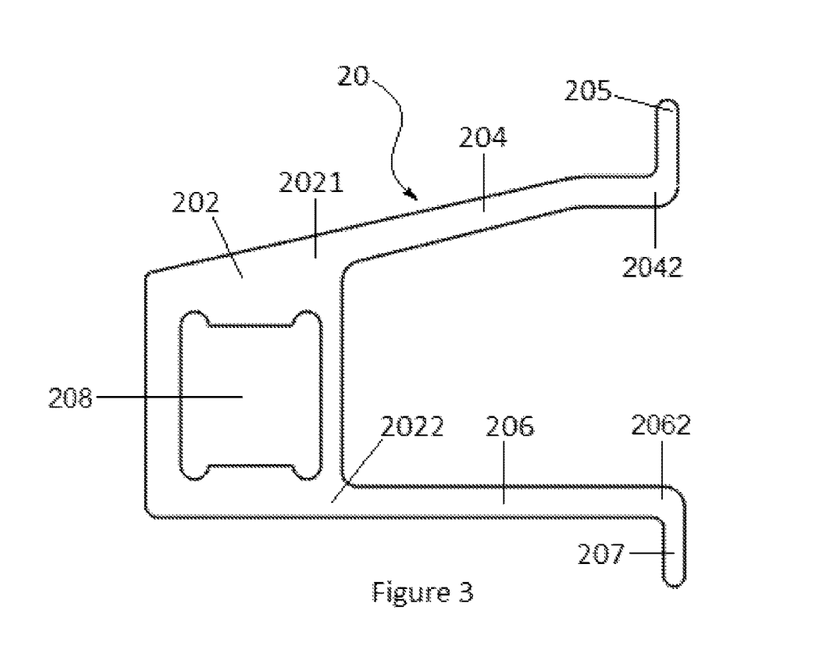
FIG. 3 shows a front view of a contact pin in an embodiment of the present invention.

Referring to FIG. 3, there is shown a contact pin (20) having a sheet-like base portion (202), a cantilever arm (204) extending from a first side (2021) of said base portion (202), a first contact portion (205) connected to an end (2042) of said cantilever arm, whereby the said first contact portion is adapted, during operation, to connect electrically with a suitable contact on an integrated circuit device. A stationary arm (206) extends from a second side (2022) of said base portion, and a second contact portion (207) is connected to an end (2062) of said stationary arm, said second contact portion adapted, during operation, to connect electrically with a suitable contact on a testing apparatus. The contact pin (20) is a flat, sheet-like cantilever member, and is constructed at least partially of electrically conductive material, such that an electrical conduit exists between said first contact portion (205) and second contact portion (207). On the said sheet-like base portion (202), there is a through-opening (208) of a certain shape and size. In a preferred embodiment, this said through opening (208) is rectangular.

Figure 4:
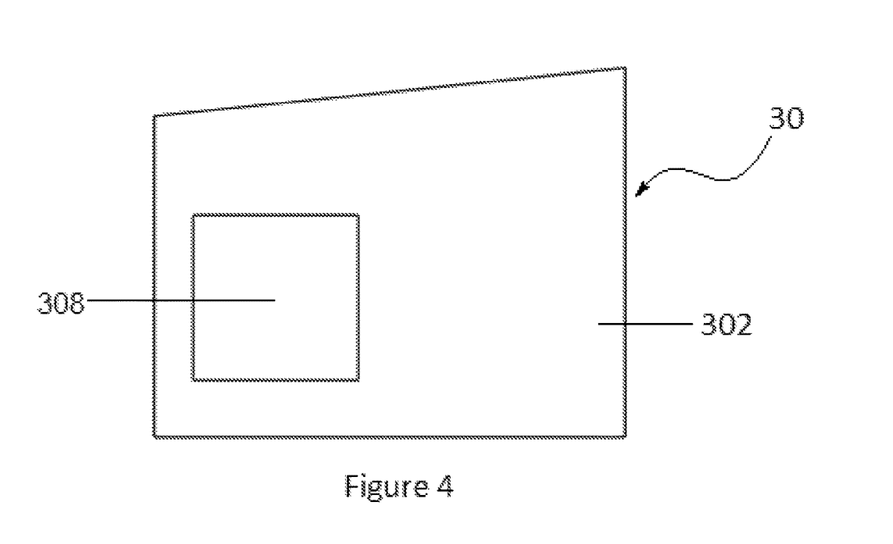
FIG. 4 shows a front view of an electrical insulator in an embodiment of the present invention.

Referring to FIG. 4, there is shown an electrical insulator (30) having a base portion (302). The electrical insulator (30) is a flat, sheet-like member, and is constructed of dielectric or electrically insulating material. On the said sheet-like base portion (302), there is a through-opening (308) of a certain shape and size. In a preferred embodiment, this said through opening (308) is rectangular.

Figure 5:
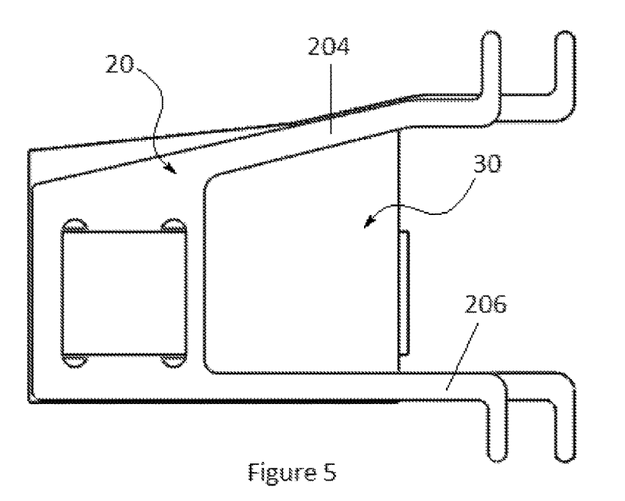
FIG. 5 shows a front view of a contact pin and electrical insulator aligned with each other in an embodiment of the present invention.

Referring to FIG. 5, there is shown two contact pins (20), each having different length cantilever arms (204) and stationary arms (206). The length of the arms on the contact pin (20) is designed with the placement of the contact pads on both the IC device and testing apparatus in mind, and thusly different contact pins (20) can be used for different IC devices. As shown in the figure, even for each testing instance, long and short contact pins (20) may be used.

Figure 6:
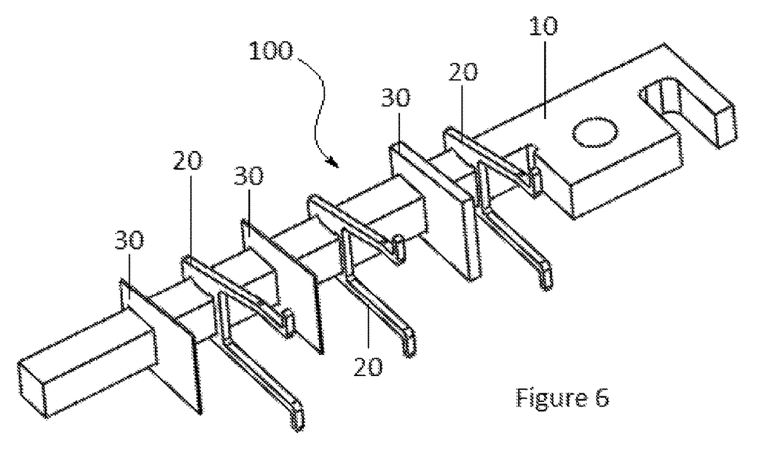
FIG. 6 shows a perspective view of a rigid shaft sub-assembly with the contact pins and electrical insulators exploded from each other for ease of viewing.

FIG. 6 shows a perspective view of a rigid shaft sub-assembly (100) with the contact pins and electrical insulators exploded from each other for ease of viewing. There is shown a rigid shaft (10), threaded through through-openings (208, 308) in several contact pins (20) and electrical insulators (30). In actual assembly, the contact pins (20) and electrical insulators (30) would be placed closer together, whereby they touch one another, as in FIG. 1.

Figure 1:
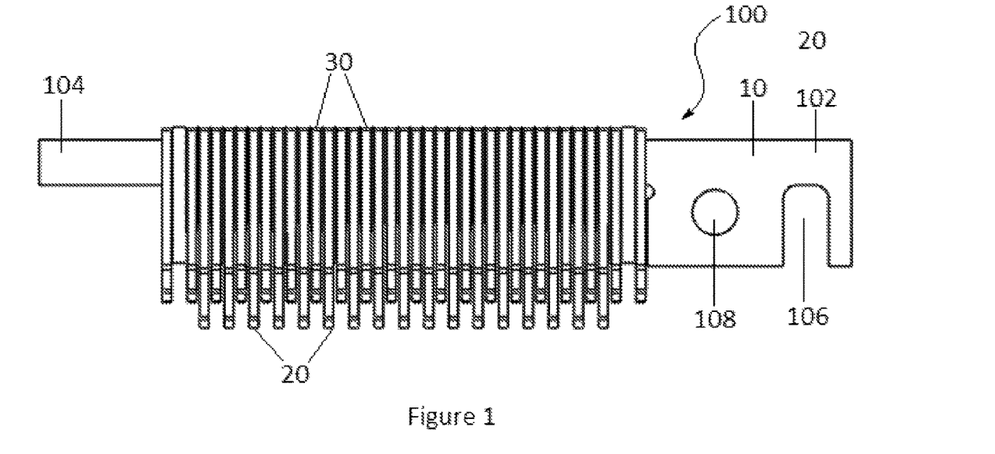
FIG. 1 shows a top view of a rigid shaft sub-assembly in an embodiment of the present invention.

Now referring to FIG. 1, there is shown a complete rigid shaft sub-assembly (100). A rigid shaft (10) is threaded or passed through through-openings in several contact pins (20) and electrical insulators (30). A cross-section of said rigid shaft (10) has the same shape and size of the said through-openings of each contact pin and electrical insulator. In a preferred embodiment, this shape and size is rectangular. Any two contact pins (20) must have an electrical insulator (30) between them, so that there is no electrical conduit between two contact pins (20). This is important to maintain the accuracy of testing results. The number of contact pins (20) on each said rigid shaft (10) can thus be varied and customized to suit a particular test.

Figure 7A:
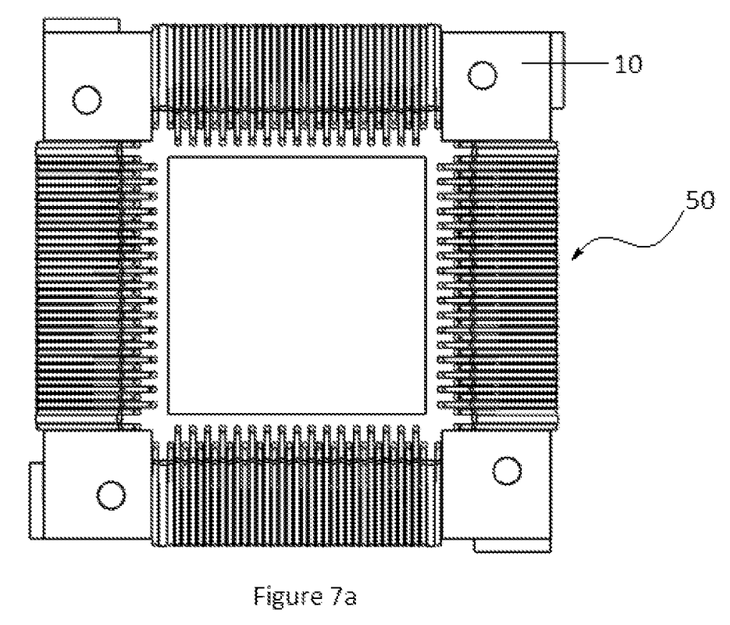
FIG. 7a shows a top view of a rectangular assembly of four rigid shafts in an embodiment of the present invention.
Figure 7B:
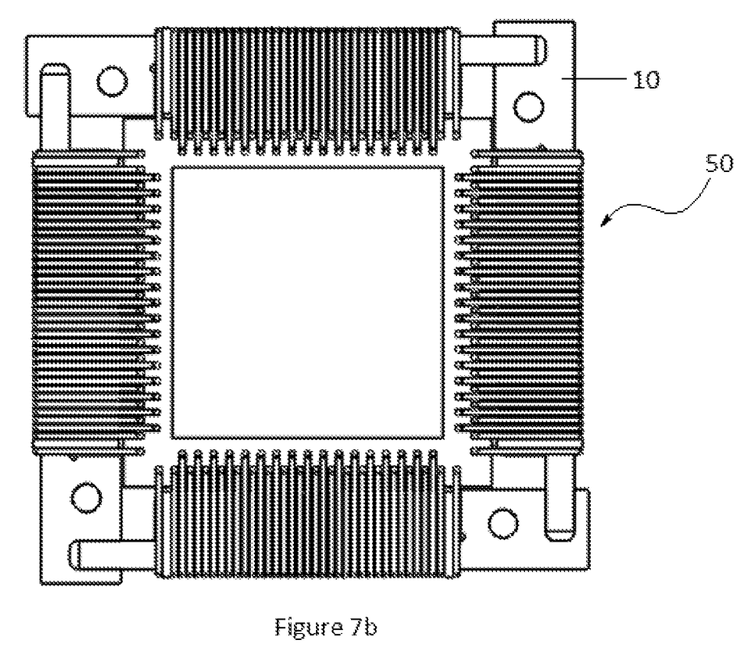
FIG. 7b shows a bottom view of a rectangular assembly of four rigid shafts in an embodiment of the present invention.
Figure 7C:
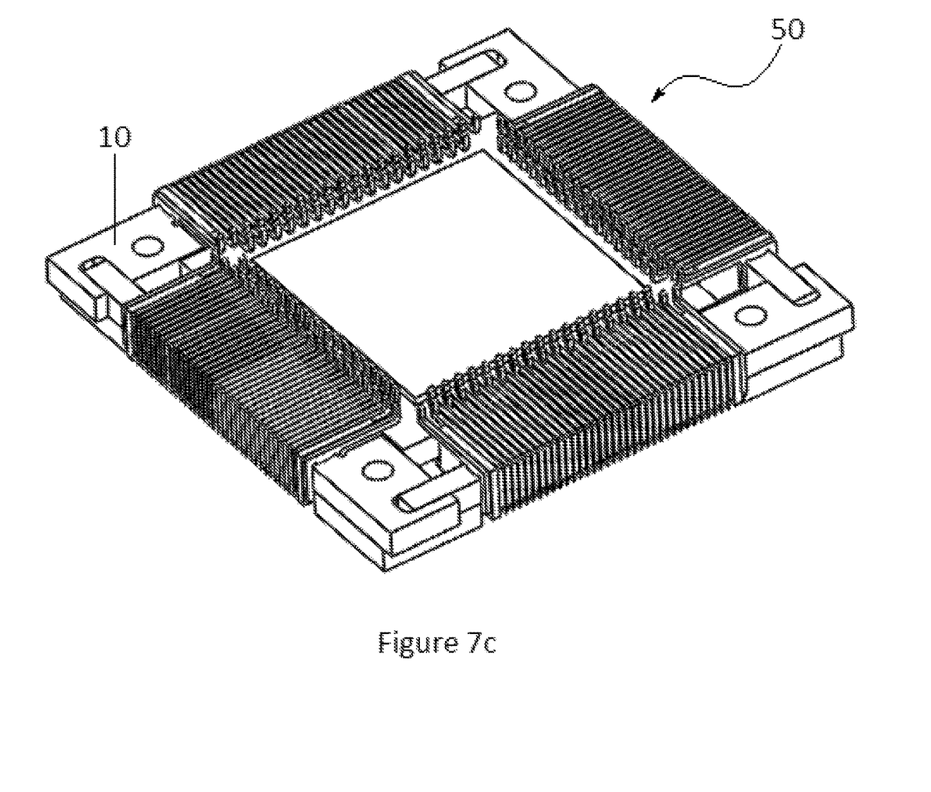
FIG. 7c shows a perspective view of a rectangular assembly of four rigid shafts in an embodiment of the present invention.

From FIG. 1, it can also be seen that the rigid shaft (10) includes a notch (106). This notch is used to interlock a first end (102) of said rigid pin to a second end (104) of a second rigid pin in a perpendicular fashion. As can be seen in FIGS. 7a through 7c, four rigid shafts may then be interlocked in this manner, and arranged to form a square or rectangular assembly, with the first end (102) of each rigid shaft (10) interlocked with the second end (104) of the rigid shaft next to it.

Referring now to FIGS. 7a through 7c, there is shown various views of a rectangular assembly (50), with four rigid shafts (10) joined together as described above. This allows rows of contact pins to be arranged in a typical square or rectangular design seen in an IC device testing apparatus.

Figure 8A:
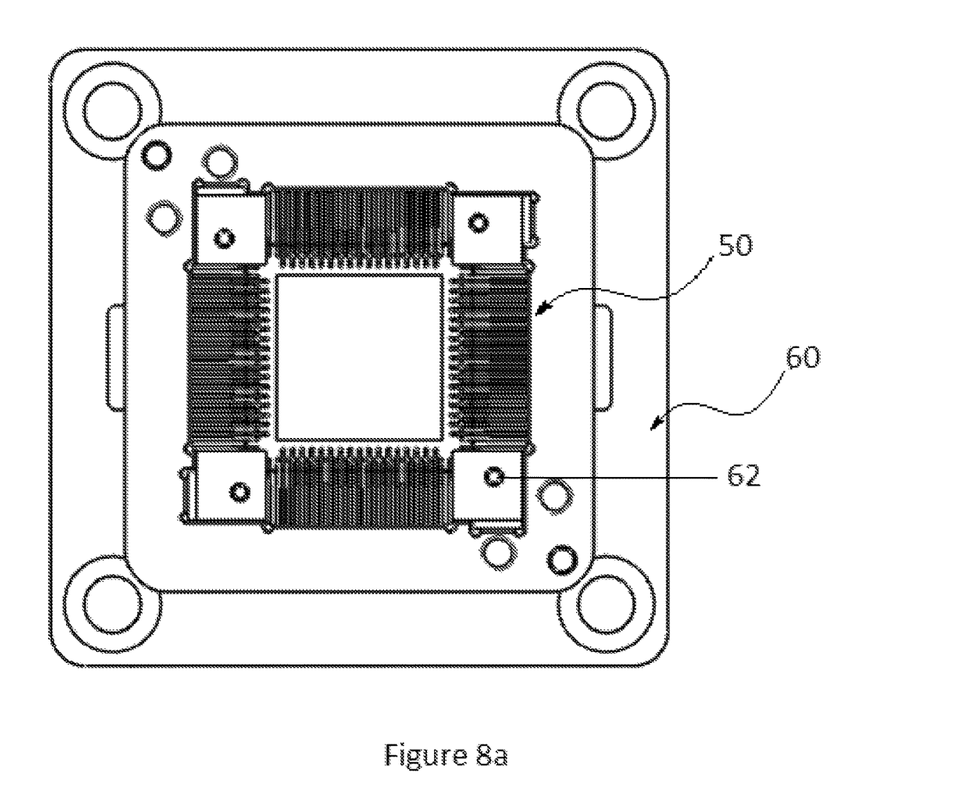
FIG. 8a shows a top view of a rectangular assembly in a testing apparatus housing in an embodiment of the present invention.
Figure 8B:
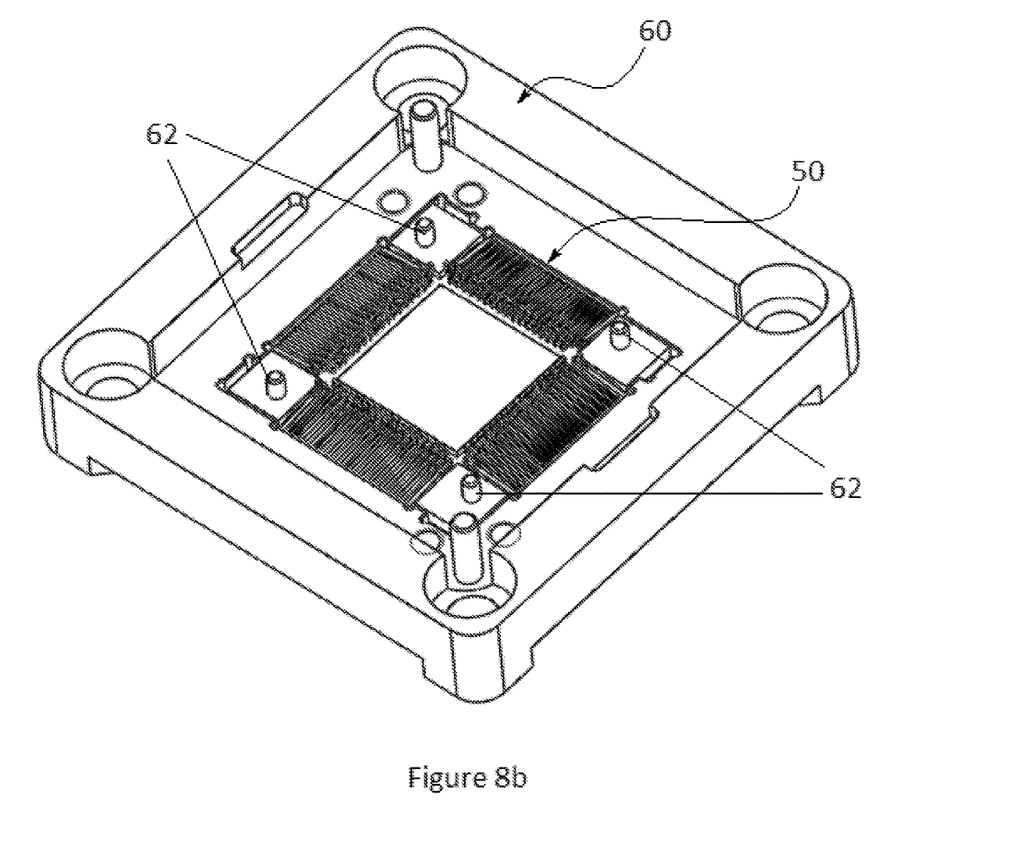
FIG. 8b shows a perspective view of a rectangular assembly in a testing apparatus housing in an embodiment of the present invention.

Referring to FIGS. 8a and 8b, there is shown a rectangular assembly (50) of this invention installed into a test apparatus housing (60). Dowel pins (62) located on the housing (60) guide and hold the said rectangular assembly (50) so that proper and precise alignment is assured.

Figure 9:
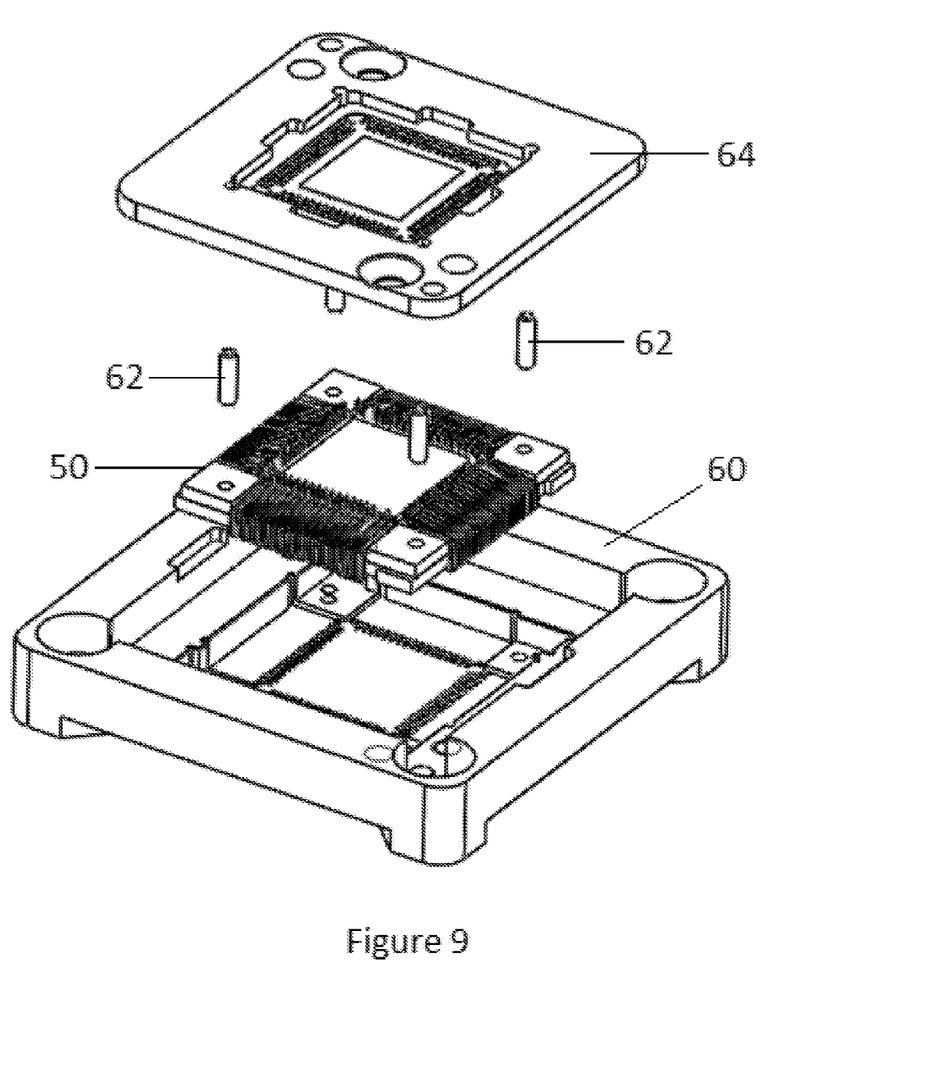
FIG. 9 shows an exploded, perspective view of a rectangular assembly in a testing apparatus housing in an embodiment of the present invention.

Referring to FIG. 9, there is shown an exploded view of a rectangular assembly (50) as it would be aligned in assembly into a test apparatus housing (60). Dowel pins (62) that would be located on the housing (60) would guide the said rectangular assembly (50) so that proper and precise alignment is assured. The top cover (64) is lastly placed over the rectangular assembly (50) to secure it in place.

While several particularly preferred embodiments of the present invention have been described and illustrated, it should now be apparent to those skilled in the art that various changes and modifications can be made without departing from the spirit and scope of the invention. Accordingly, the following claims are intended to embrace such changes, modifications, and areas of application that are within the scope of this invention.

The invention claimed is:

1. An electrical contact assembly for use in an integrated circuit testing apparatus, comprising:
    a substantially rigid shaft having a cross-section of a particular shape and size, and constructed of an electrically insulating material;
    a plurality of contact pins, each said contact pin having a through-opening substantially matching to said particular shape and size of said cross-section of said rigid shaft, such that said rigid shaft may slide through said through-opening of said contact pin and thus secure said contact pin from substantial rotation about a longitudinal axis of said rigid shaft; and
    at least one electrical insulator, each said electrical insulator having a through-opening substantially matching to said particular shape and size of said cross-section of said rigid shaft, such that said rigid shaft may slide through said through-opening of said electrical insulator and thus secure said electrical insulator from substantial rotation about a longitudinal axis of said rigid shaft, and each said at least one electrical insulator placed substantially between any two said contact pins, such that there is no electrical connection between any two said contact pins.

2. An electrical contact assembly for use in an integrated circuit testing apparatus in accordance with claim 1, wherein each said contact pin includes a sheet-like base portion, on which base portion said through-opening is formed.

3. An electrical contact assembly for use in an integrated circuit testing apparatus in accordance with claim 2, wherein each contact pin further includes a cantilever arm extending from a first side of said base portion, a first contact portion connected to an end of said cantilever arm, said first contact portion adapted, during operation, to connect electrically with a suitable contact on an integrated circuit device, a stationary arm extending from a second side of said base portion, and a second contact portion connected to an end of said stationary arm, said second contact portion adapted, during operation, to connect electrically with a suitable contact on a testing apparatus.

4. An electrical contact assembly for use in an integrated circuit testing apparatus in accordance with claim 1, wherein each said electrical insulator includes a sheet-like base portion, on which base portion said through-opening is formed.

5. An electrical contact assembly for use in an integrated circuit testing apparatus in accordance with claim 1, wherein the said cross-section of the rigid shaft has a rectangular shape.

6. An electrical contact assembly for use in an integrated circuit testing apparatus in accordance with claim 1, wherein said rigid shaft includes, at a first end, a means of interlocking, in a perpendicular fashion, with a second end of another of said rigid shafts.

7. An electrical contact assembly for use in an integrated circuit testing apparatus in accordance with claim 6, wherein the said means of interlocking comprises a notch on said first end of the rigid shaft, said notch adapted to receive said second end of the rigid shaft.

8. An electrical contact assembly for use in an integrated circuit testing apparatus in accordance with claim 6, whereby there are four of said rigid shafts, arranged to form a rectangular assembly, with said first end of each rigid shaft interlocked with said second end of the rigid shaft next to it.

9. An electrical contact assembly for use in an integrated circuit testing apparatus in accordance with claim 8, wherein each said rigid shaft further comprises a through-hole at said first end, said through-hole adapted to assist proper alignment of said rectangular assembly during assembly into a testing apparatus housing.

10. A method of assembling an electrical contact assembly for use in an integrated circuit testing apparatus, comprising the steps of:
   a) sliding a rigid shaft through a matching through-opening of a contact pin, until said contact pin reaches an intermediate point along said rigid shaft;
   b) sliding said rigid shaft through a matching through-opening of an electrical insulator, until said electrical insulator rests next to said contact pin along said rigid shaft;
   c) sliding said rigid shaft through a matching through-opening of a second contact pin, until said second contact pin rests next to said electrical insulator along said rigid shaft, and said electrical insulator is sandwiched between said first and second contact pins; and
   d) repeating steps b) and c) until the desired number of contact pins has been arranged along said rigid shaft.

11. A method of assembling an electrical contact assembly for use in an integrated circuit testing apparatus in accordance with claim 10, further comprising the steps of:
   e) joining a first end of said rigid shaft to a second end of a second rigid shaft such that both rigid shafts are interlocked, in a perpendicular fashion;
   f) joining a third and fourth rigid shaft as in e), such that the four rigid shafts form a rectangular assembly;
   g) fitting said rectangular assembly into a testing apparatus housing.

* * * * *